United States Patent [19]

Masuoka

[11] 4,419,682

[45] Dec. 6, 1983

[54] THREE LEVEL POLY DYNAMIC RAM WITH POLY BIT LINES

[75] Inventor: Fujio Masuoka, Yokohama, Japan

[73] Assignee: Tokyo Shibaura Denki Kabushiki Kaisha, Kawasaki, Japan

[21] Appl. No.: 227,936

[22] Filed: Jan. 23, 1981

[30] Foreign Application Priority Data

Jan. 25, 1980 [JP] Japan .................................. 55-7519
Jan. 25, 1980 [JP] Japan .................................. 55-7520
Jan. 25, 1980 [JP] Japan .................................. 55-7524

[51] Int. Cl.³ ..................... H01L 27/10; H01L 23/50; G11C 11/40
[52] U.S. Cl. ......................................... 357/23; 357/41; 357/59; 357/71
[58] Field of Search ................... 357/23 C, 23 CS, 41, 357/59, 52, 71 S

[56] References Cited

U.S. PATENT DOCUMENTS

| | | |
|---|---|---|
| 4,012,757 | 3/1977 | Koo . |
| 4,060,796 | 11/1977 | Togei et al. ........................ 357/23 C |
| 4,115,795 | 9/1978 | Masuoka et al. . |
| 4,131,906 | 12/1978 | Kinoshita .......................... 357/23 C |
| 4,240,092 | 12/1980 | Kuo .................................... 357/23 C |
| 4,240,195 | 12/1980 | Clemens et al. .................. 357/23 C |
| 4,262,298 | 4/1981 | Tuan et al. ........................ 357/23 C |
| 4,291,322 | 9/1981 | Clemens et al. .................. 357/23 C |
| 4,334,236 | 6/1982 | Hoffmann et al. ..................... 357/59 |

OTHER PUBLICATIONS

Chatterjee et al., "A Survey of High-Density Dynamic RAM Cell Concepts", IEEE Transactions on Electron Devices 827–839 (Jun. 1979).

Primary Examiner—William D. Larkins
Attorney, Agent, or Firm—Finnegan, Henderson, Farabow, Garrett & Dunner

[57] ABSTRACT

First polycrystalline silicon layers are insulatively disposed over a p-type semiconductor substrate. Second polycrystalline silicon layers are formed on the substrate adjacent to the first polycrystalline silicon layers. Third polycrystalline silicon layers are insulatively disposed over the substrate between the first polycrystalline silicon layers and the second polycrystalline silicon layers. The third polycrystalline silicon layers function as gates of MOS transistors, and the first polycrystalline silicon layers function as capacitors in cooperation with the substrate. The second polycrystalline silicon layers function as the digit lines, and are so formed as to alternately contact substrate and pass over the first polycrystalline silicon layers insulated therefrom by thick insulative layers.

4 Claims, 24 Drawing Figures

F I G. 11
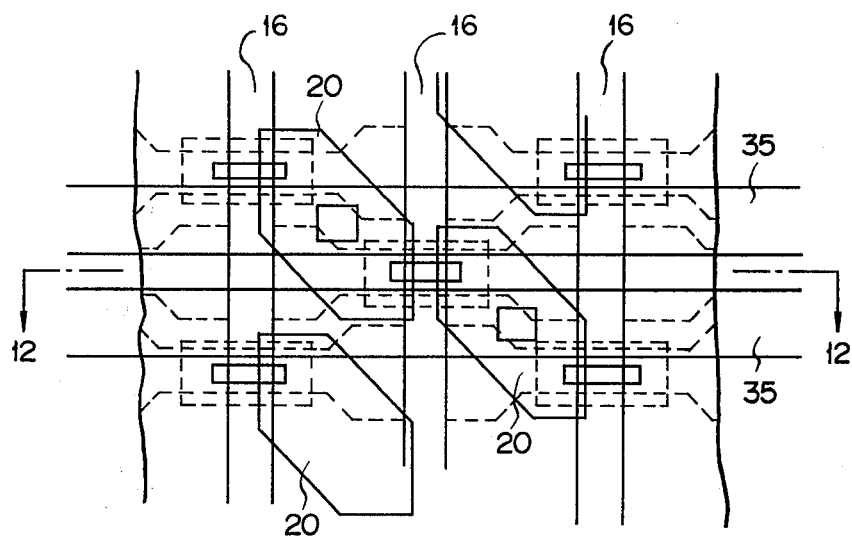
F I G. 12
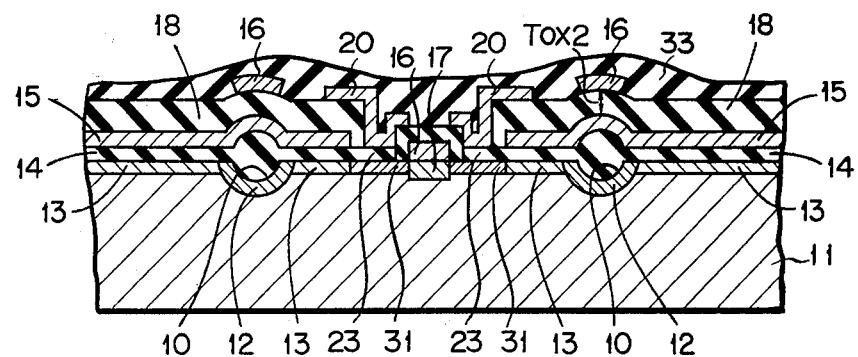

THREE LEVEL POLY DYNAMIC RAM WITH POLY BIT LINES

The present invention relates to a semiconductor memory device and, more particularly, to a single-transistor dynamic memory device.

A single-transistor dynamic memory device employing polycrystalline silicon, and comprising 1 bit with a MOS transistor and a MOS capacitor is already known. For example, in a single-transistor dynamic memory device disclosed in U.S. Pat. No. 4,012,757, n-type regions are formed, parallel to each other, in a p-type semiconductor substrate. High concentration p-type field regions are selectively formed in such a manner that finger-like island regions are formed perpendicularly to the n-type regions. First polycrystalline silicon layers are insulatively disposed over an interdigitated pattern comprising the finger-like island regions. Second polycrystalline silicon layers are insulatively disposed over the first polycrystalline silicon layers. With such a semiconductor structure, the first polycrystalline silicon layers and the finger-like island regions (capacitor region) comprise capacitors. The second polycrystalline silicon layers function as gates of the MOS transistors, and the n-type regions function as digit lines.

In a single-transistor dynamic memory device, reading out of the data is performed by detecting the change in potential of the digit line. For example, when a predetermined memory cell is selected, a charge $Q_S$ is stored on a capacitor $C_S$ of the memory cell, and a potential $V_S$ induced by the charge $Q_S$ acts on the digit line. Due to this, the potential of the digit line changes. For example, when the potential changes from $V_D$ to $V_{D'}$, the change $\Delta V_D$ of the potential may be represented by the following equation:

$$\Delta V_D = V_D - V_{D'}$$
$$= \frac{(C_S + C_D)V_D - (C_S V_S + C_D V_D)}{C_S + C_D}$$
$$= \frac{C_S(V_D - V_S)}{C_S + C_D}$$

where, $C_D$ is the stray capacitance such as a p-n junction capacitance induced between the digit line and the substrate, and $C_S$ is the coupling capacitance induced between the transfer gates.

As may be apparent from the above equation, the change $\Delta V_D$ of the potential of the digit line is proportional to $C_S/(C_S+C_D)=A$. Therefore, the greater the A, the greater the charge stored on the capacitor of the memory cell, and the greater the change $\Delta V_D$ of the potential, so that the reading out of the data becomes easier and more precise.

However, with the conventional dynamic memory device, the digit line comprises an n-type region so that the p-n junction capacitance induced between the digit line region and the substrate is large, and the coupling capacitance between the transfer gates is also large. Due to this, the stray capacitance $C_D$ becomes large and the A becomes small so that a sense amplifier of high sensitivity is required for reading out the data. The ratio of the overlapping area of the first polycrystalline silicon layer and the inversion region to the occupying area of the memory cell must be made large so as to make the $C_S$ greater to maintain the A in the range of 0.1 to 0.05. Further, since the digit line is formed as a column line due to restrictions imposed on high packing density by the photoetching technique, the digit line occupies a large area with respect to the occupying area of the memory cell.

The primary object of the present invention, therefore, is to provide a single-transistor dynamic memory device wherein polycrystalline silicon is used for a digit line to decrease the capacitance due to the digit lines.

Another object of the present invention is to provide a single-transistor dynamic memory device wherein the digit lines formed of polycrystalline silicon are formed by multi-layered wirings whereby the areas occupied by the digit lines and the field regions are decreased.

According to the present invention, there is provided a single-transistor dynamic memory device wherein a first insulative layer having a plurality of openings arranged in a predetermined pattern is formed on a semiconductor substrate of a first conductivity type, and first polycrystalline silicon layers are formed on the first insulative layer. Second polycrystaline silicon layers are contacted with the substrate through the openings and disposed over the first polycrystalline silicon layers upon a second insulative layer. Second conductivity type regions are formed at the parts of the substrate which are in contact with the second polycrystalline silicon layers, and third polycrystalline silicon layers are each insulatively disposed over the substrate between the second conductivity type regions and the first polycrystalline silicon layer. These third polycrystalline silicon layers function as the gates of the MOS transistors, and the first polycrystalline silicon layers and the substrate comprise capacitors. The second polycrystalline silicon layers function as the digit lines.

The invention can be more fully understood from the following detailed description when taken in conjunction with the accompanying drawings, in which:

FIG. 11 is a plan view of the dynamic memory device in the final step;

FIG. 12 is a sectional view along the line 12—12 of FIG. 11;

Figure 1:
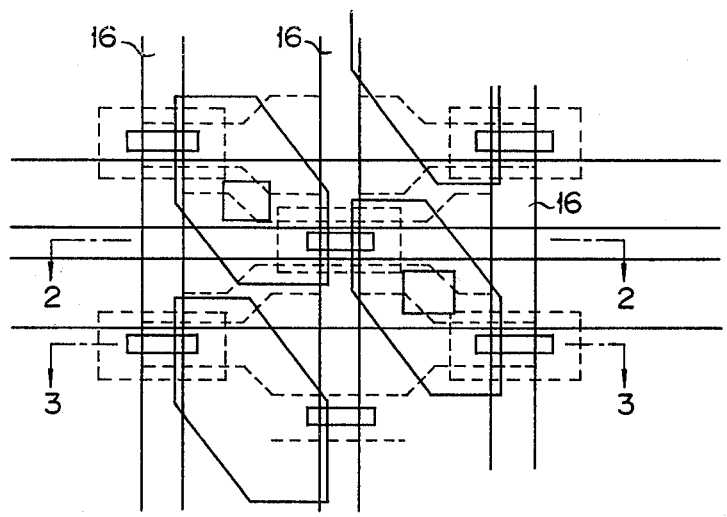
FIG. 1 is a plan view of the dynamic memory device according to one embodiment of the present invention.
Figure 2:
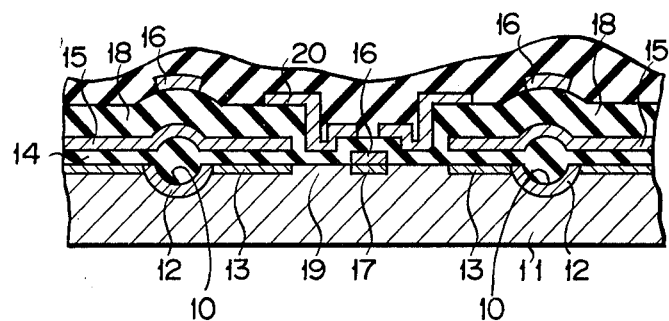
FIG. 2 is a sectional view of the dynamic memory device along the line 2—2 of FIG. 1.
Figure 3:
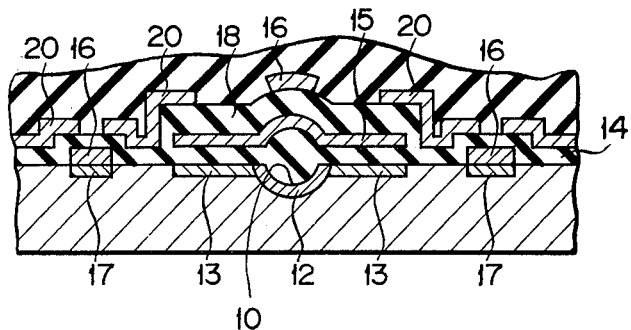
FIG. 3 is a sectional view of the dynamic memory device along the line 3—3 of FIG. 1.

According to the embodiment shown in FIGS. 1 to 3, recesses 10 are selectively formed in a p-type semiconductor substrate 11, and p+-type field regions 12 are formed at the parts of the substrate 11 corresponding to these recesses. n−-type regions 13 are formed at both sides of these p+-type field regions 12. An insulative layer, for example a SiO$_2$ film 14, is formed on the substrate 11 in which are formed the regions 12 and 13. The SiO$_2$ film 14 comprises thick SiO$_2$ films (5,000 Å) formed in correspondence with the p+-type field regions 12 and thin SiO$_2$ films (500 Å) formed in correspondence with the n−-type regions 13. First polycrystalline silicon layers 15 are formed on the SiO$_2$ film 14. As shown in the figures, these first polycrystalline silicon layers 15 are various portions of a single continuous layer. Second polycrystalline silicon layers 16 are formed in such a manner so that they are in contact with the substrate 11 between the adjacent first polycrystalline silicon layers 15. These second polycrystalline silicon layers 16 each extend alternately on the substrate 11 and on a thick SiO$_2$ film 18 (5,000 Å) formed on the first polycrystalline silicon layer 15. Third polycrystalline silicon layers 20, each, are insulatively disposed over the substrate 11 between the first polycrystalline silicon layer 15 and the adjacent second polycrystalline silicon layer 16. n+-type regions 17 are formed at the parts of the substrate 11 which are in contact with the second polycrystalline silicon layer 16. These n+-type regions 17 are formed by diffusing an impurity which has been doped in the second polycrystalline silicon layers 16 into the substrate 11, that is, formed by so-called self-alignment as will be described later.

Figure 4:
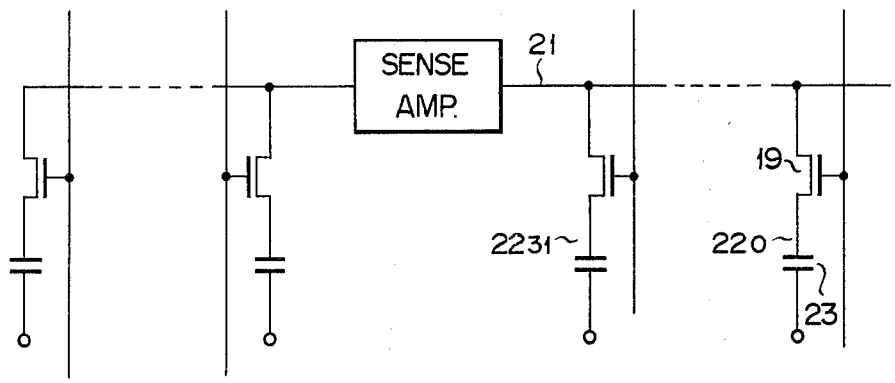
FIG. 4 is a circuit diagram of the dynamic memory device of FIG. 1.

In the semiconductor structure as described above, the first polycrystalline silicon layer 15 and the n-type region 13 comprise a capacitor. The n−-type region 13, the third polycrystalline silicon layer 20, and the n+-type region 17 comprise a MOS transistor. The second polycrystalline silicon layer 16 functions as the digit line, and also functions as the source or drain of the MOS transistor in cooperation with the n+-type region 17. The dynamic memory device of such a structure has a circuit configuration as shown in FIG. 4. In the dynamic memory device, 32 memory cells 22$_0$ to 22$_{31}$ are connected to one digit line 21. Each of the memory cells comprises a capacitor 23 and an address-selecting MOS transistor 19, the drain or source of which is connected to the digit line 21.

Figure 5:
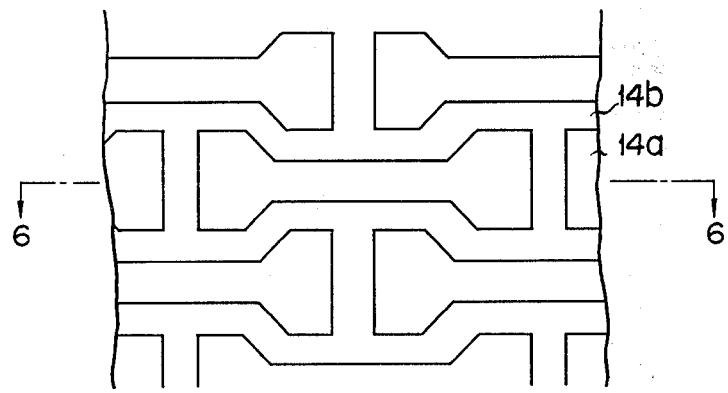
FIG. 5 is a plan view of the semiconductor structure during the first manufacturing step of the dynamic memory device shown in FIGS. 1 to 3.
Figure 6:
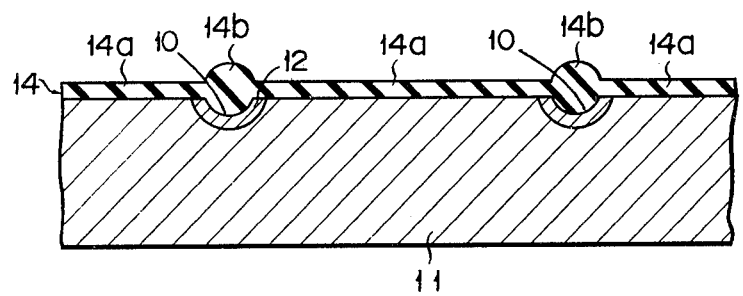
FIG. 6 is a sectional view along the line 6—6 of FIG. 5.
Figure 7:
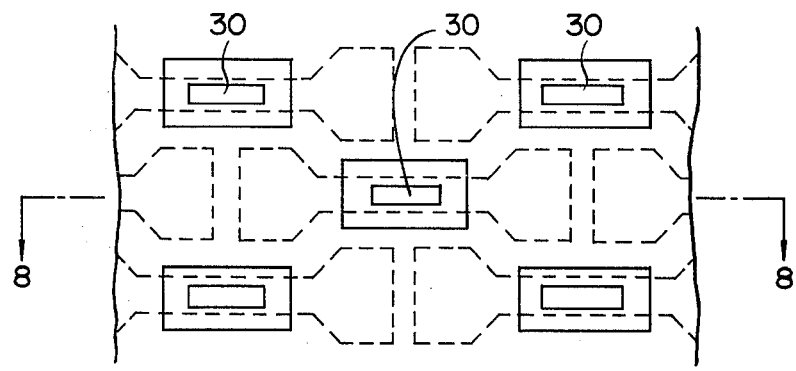
FIG. 7 is a plan view of the semiconductor structure in the next step.
Figure 8:
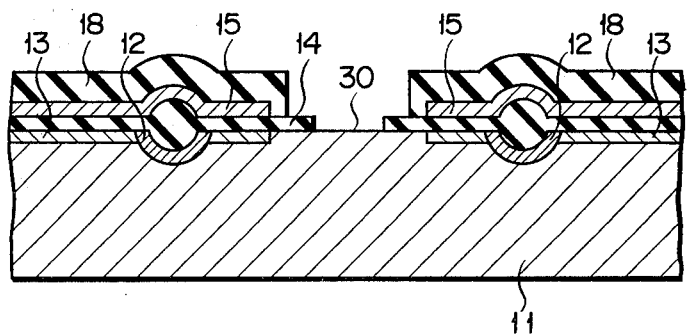
FIG. 8 is a sectional view along the line 8—8 of FIG. 7.

The manufacturing method of the single-transistor type dynamic memory device described above will be described. First, as shown in FIGS. 5 and 6, the SiO$_2$ film 14 comprising thin SiO$_2$ films 14a (500 to 1,000 Å) and thick SiO$_2$ films 14b (5,000 to 10,000 Å) formed at both sides of these thin SiO$_2$ films is formed on the p−-type substrate 11 on which are selectively formed recesses 10. The thick SiO$_2$ films 14b comprise the field oxide parts. p+-type regions 12 of the same impurity as that of the substrate 11 but of a higher concentration than that of the substrate 11 are formed below the SiO$_2$ films 14b. These p+-type regions 12 function as field inversion preventive layers. Next, as shown in FIGS. 7 and 8, the first polycrystalline silicon layers 15 are grown by chemical vapor deposition (CVD), and contact holes 30 for digit lines are formed. The n+-type regions 13 are formed at both sides of the p+-type regions 12 in opposition to the first polycrystalline silicon layers 15. Thick SiO$_2$ films 18 of over 5,000 Å are formed on the first polycrystalline silicon layers 15.

Figure 9:
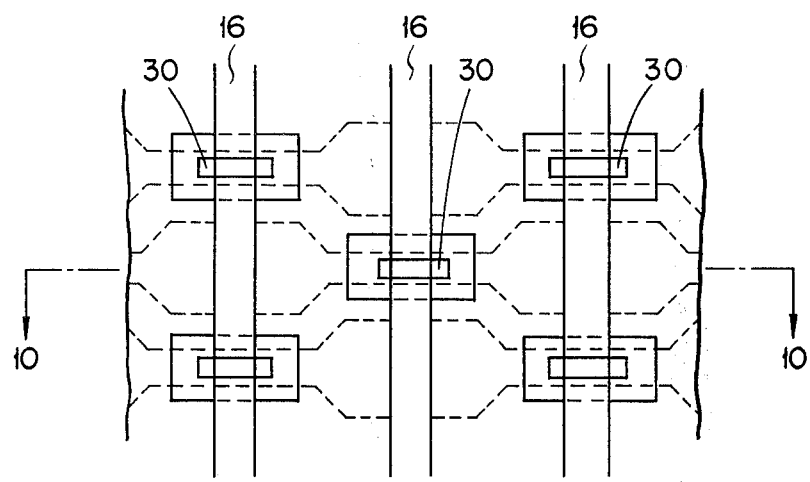
FIG. 9 is a plan view of the semiconductor structure in a still further step.
Figure 10:
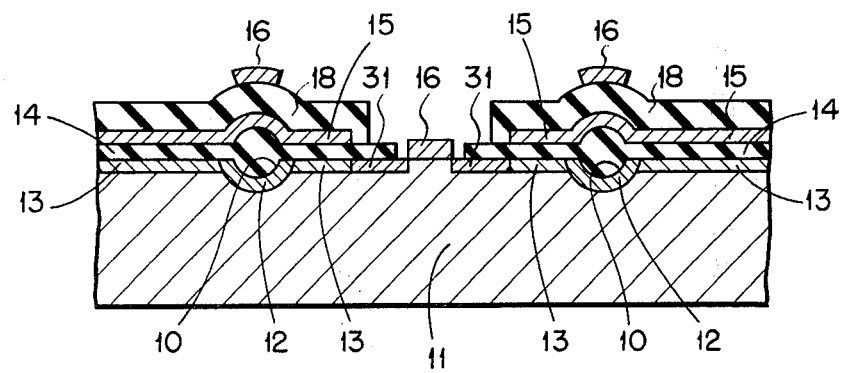
FIG. 10 is a sectional view along the line 10—10 of FIG. 9.

The second polycrystalline silicon layers 16 as the digit lines are formed on the substrate through the contact holes 30 as shown in FIGS. 2, 9 and 10. In this case, the second polycrystalline silicon layers 16 are so formed as to extend on the SiO$_2$ films 18 formed on the first polycrystalline silicon layers 15, which together with n−-type regions 13 constitute the capacitor of one memory cell, and to contact the substrate 11 through the contact hole of the next memory cell. That is, the second polycrystalline silicon layers 16 are formed in a waveform alternately resting upon the substrate 11 and the SiO$_2$ films 18. The second polycrystalline silicon layers 16 are doped with an n-type dopant, for example phosphorus or arsenic, while the first polycrystalline silicon layers 15 do not contain a dopant such as phosphorus and arsenic.

In order that address-selecting transistors be formed at parts of the substrate 11 which do not lie below either first or second polycrystalline silicon layers 15 and 16, it is preferable that a p-type impurity such as boron be implanted at such parts at a dose of 1 to $5\times10^{10}$ cm$^{-2}$ to form regions 31. However, the impurity implantation dose applied to form regions 31 must be suitably selected depending upon the concentration of the dopant in substrate 11 and the other conditions, and need not be limited to 1 to $5\times10^{10}$ cm$^{-2}$. After selectively etching the oxide film from the surface of the semiconductor substrate shown in FIG. 10, the gate oxide films 23 of the address-selecting MOS transistors are formed by thermal oxidation thereon. The third polycrystalline silicon layers 20 are formed on the gate oxide films 23 for the gates. Thereafter, as shown in FIG. 12, the n-type impurity such as phosphorus or arsenic doped in the second polycrystalline silicon layers 16 is diffused in the substrate 11 to form the n+-type regions 17. In this case, since the n+-type regions 17 are formed by diffusing the impurity contained in the second polycrystalline silicon layers 16, that is, by so-called self-alignment, mask aligning spaces for the n+-type regions 17 and the second polycrystalline silicon layers 16 functioning as the digit lines need not be included, so that the n+-type regions 17 may be formed with the smallest occupying area. Furthermore, the occupying area may be decreased relative to the capacitance of the capacitor comprising first polycrystalline silicon layer 15 and n−-type region 13, and the capacitance of the depletion layer associated with the digit lines may be decreased. A passivation film 33 is formed on the entire semiconductor structure. Contact holes (not shown) for aluminum wirings are selectively formed in the passivation film 33, and aluminum wirings 35 are formed through such contact holes as shown in FIG. 11.

With the single-transistor type dynamic memory device manufactured in such a manner, since the second polycrystalline silicon layers 16 make up the digit lines, the digit lines overlap with the capacitor parts of the memory cells so that the area for the digit line wirings may be decreased. Although it is conventionally necessary to form two field parts, one for the digit line and one for the capacitor, only one field part need be formed for the capacitor and the packing density may be improved according to the present invention. More specifically, a total area corresponding to 14μ, 6μ for one field part for the digit line and 8μ for one field inversion preventive layer, may be saved as compared with the conventional memory device. As a result, the area is decreased by 14μ/2=7μ per bit. Furthermore, since the digit lines are made up of the second polycrystalline silicon layers 16 and the thickness $T_{Ox2}$ of the SiO$_2$ film 18 between the second polycrystalline silicon layer and the first polycrystalline silicon layer 15 may be set at twice as great as the gate oxide film 23 for the address-selecting MOS transistor. $T_{Ox2}$ is greater than 5,000 Å in the embodiment.) Thus, according to the present invention, the stray capacitance of the digit lines may be significantly reduced as compared with the conventional devices.

When $A=C_S/(C_S+C_D)$ is assumed to be the same as in the conventional cases, a memory cell with a decreased occupying area per bit may be realized. Furthermore, most of the capacitance of the digit line is determined by the p$^+$-n$^+$ junction capacitance with the conventional memory devices. Thus, it is necessary to apply a deep back bias voltage between the substrate and the digit lines. In general, a back bias is applied between the substrate and the reference potential of the circuit as a sub bias. However, according to the present invention, since the stray capacitance of the digit lines is determined by the thickness $T_{Ox2}$ of the SiO$_2$ films so that the stray capacitance may be reduced by controlling the thickness $T_{Ox2}$, the back bias as adopted in the conventional memory device need not be applied. According to the present invention, the digit lines and the diffusion regions of the address-selecting transistors of the memory cells may be formed by the self-alignment method. As shown in FIG. 2, the information readout regions 17 of the memory cells are formed by diffusing an impurity such as arsenic or phosphorus through the second polycrystalline silicon layers 16, so that the digit line wirings and the regions 17 are completely self-aligned leaving no unnecessary areas. Thus, the packing density of the memory cells may be improved. The n$^+$-type impurity for forming the regions 17 is diffused after forming the third polycrystalline silicon layers 20. The channel length of the address-selecting MOS transistors is determined by the alignment precision between the first polycrystalline silicon layer 15 and the second polycrystalline silicon layer 16, and is not directly related to the alignment precision of the third polycrystalline silicon layer 20 as the gate of the MOS transistors. However, it is necessary to form the third polycrystalline silicon layer 20 to at least partially overlap with the first and second polycrystalline silicon layers 15, 16.

In the embodiment described above, the portion 14b of SiO$_2$ film 14 corresponding to the field inversion preventive region 12 is formed to be thick. However, the portion of the SiO$_2$ film corresponding to field inversion regions may be formed to have the same thickness as the portion of the SiO$_2$ film corresponding to the field region in the manner shown in FIG. 13. According to the embodiment of FIG. 13, the p$^+$-type field inversion preventive regions 12 are formed in the p-type semiconductor substrate 11, and the n$^-$-type regions 13 are formed at both sides of the regions 12. An insulative layer, for example, a SiO$_2$ film 114 of 500 Å uniform thickness, is formed on the substrate 11 in which are formed the regions 12 and 13. The first polycrystalline silicon layers 15 are selectively formed on the SiO$_2$ film 114. The SiO$_2$ films 18 of, for example, 5,000 Å thickness, are formed on the first polycrystalline silicon layers 15. The second polycrystalline silicon layers 16 are formed parallel to each other in such a manner as to alternately extend over the surfaces of the SiO$_2$ films 18 and the substrate 11. The n$^+$-type regions 17 are formed at the parts of the substrate 11 which are in contact with the second polycrystalline silicon layers 16. As has been described with reference to the first embodiment, the n$^+$-type regions 17 are formed by diffusing an impurity doped in the second polycrystalline silicon layers 16 into the substrate 11, that is by so-called self-alignment. The third polycrystalline silicon layers 20, are each insulatively disposed over the substrate 11 between the first polycrystalline silicon layer 15 and the adjacent second polycrystalline silicon layer 16.

As has been described, in this embodiment, the portions of the SiO$_2$ films corresponding to the field inversion preventive regions are not formed to be thick, and the space between the first polycrystalline silicon layers and the substrate is uniform so that stepped portions may be eliminated from the memory chip.

Figure 13:
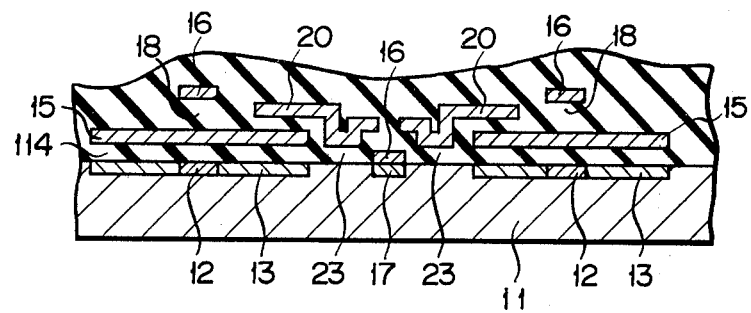
FIG. 13 is a sectional view of the dynamic memory device according to another embodiment of the present invention.
Figure 14:
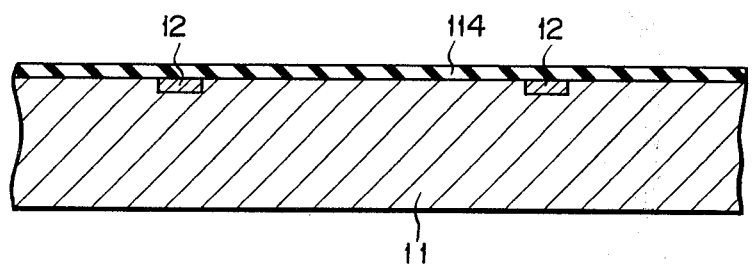
FIG. 14 is a sectional view illustrating the semiconductor structure during the manufacturing step of the semiconductor memory device of FIG. 13.
Figure 15:
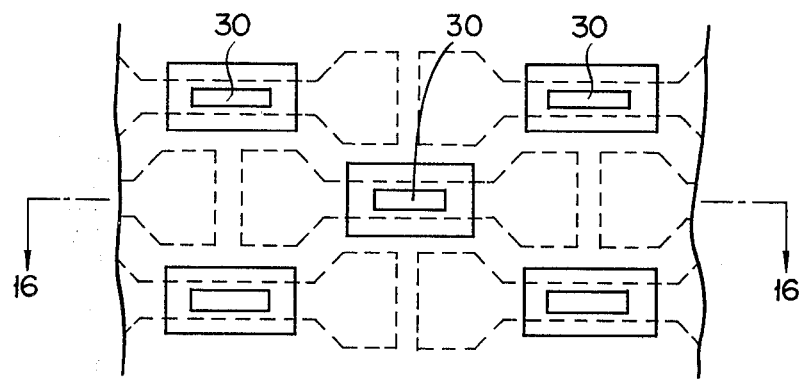
FIG. 15 is a plan view of the semiconductor structure in the next step.
Figure 16:
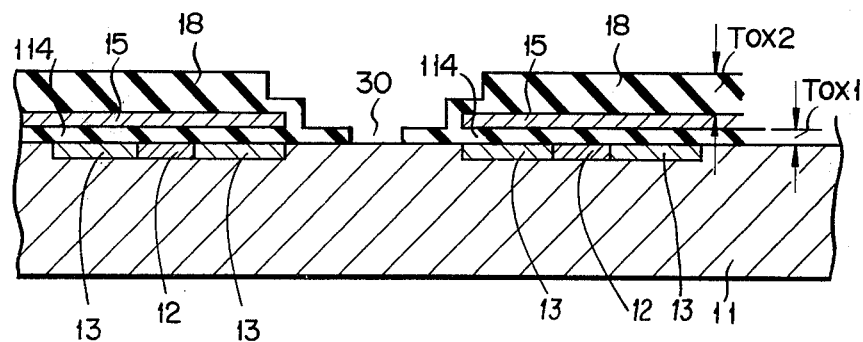
FIG. 16 is a sectional view along the line 16—16 of FIG. 15.
Figure 17:
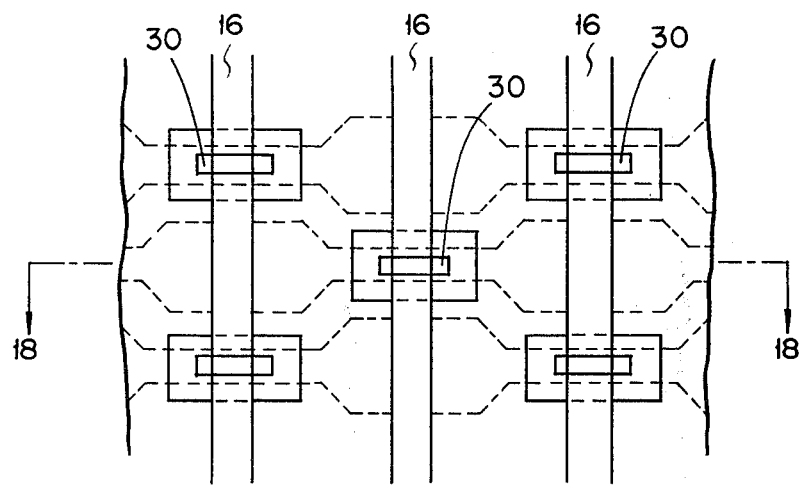
FIG. 17 is a plan view illustrating the semiconductor structure in the next step.
Figure 18:
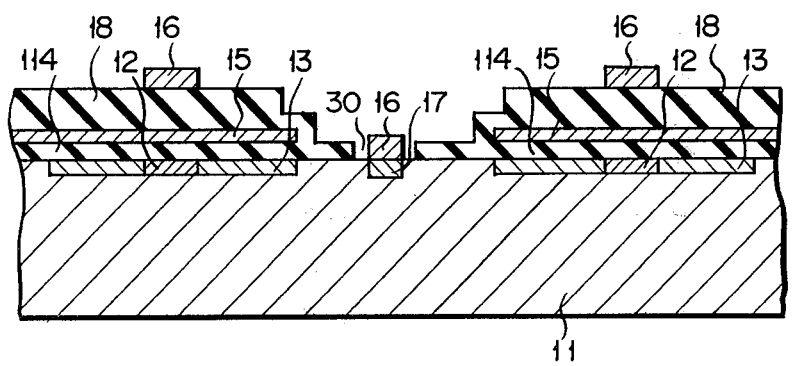
FIG. 18 is a sectional view along the line 18—18 of FIG. 17.

The manufacturing method of the dynamic memory device shown in FIG. 13 will now be described. In the step shown in FIG. 14, an impurity, for example, boron is implanted in the p-type semiconductor substrate 11 of 20 Ω·cm to selectively form p$^+$-type regions of 1×10$^{13}$ cm$^{-2}$ impurity concentration, that is, field inversion preventive regions 12. The oxide layer 114 of 500 Å thickness is formed on the substrate 11 by thermal oxidation. Thereafter, as shown in FIGS. 15 and 16, the first polycrystalline layers 15 are grown on the oxide layer 114 by chemical vapor deposition. Further, thick silicon dioxide films 18 of 5,000 Å are formed by chemical vapor deposition or vacuum evaporation on the first polycrystalline silicon layers 15. Thereafter, the contact holes 30 for the digit line wirings are selectively formed. As shown in FIGS. 17 and 18, the second polycrystalline silicon layers 16 for the digit lines are formed on the substrate 11 through the contact holes 30 and on the SiO$_2$ films 18. In this case, it is preferable that the second polycrystalline silicon layers 16 be completely within the contact holes 30 and on the thick oxide films 18 above the first polycrystalline silicon layers 15. The n$^+$-type regions 13 are formed at both sides of the p$^+$-type field regions 12. These n$^+$-type regions 13 are formed for increasing the storage capacity of the memory cells and for rendering the device operative even when the potential of the first polycrystalline silicon layers 15 used as one electrode of the capacitor of the memory cell is made the same as the substrate potential or the reference potential.

The impurity contained in the second polycrystalline silicon layers 16 is diffused in the substrate 11 to form the n+-type regions 17 as the data input and output terminals of the memory cells. Thus, these n+-type regions 17 are self-aligned with the second polycrystalline silicon layers. The second polycrystalline silicon layers 16 function as the digit lines of the memory cells as well as the drains of the address-selecting transistors of the memory cells in cooperation with the n+-type regions 17.

Figure 19:
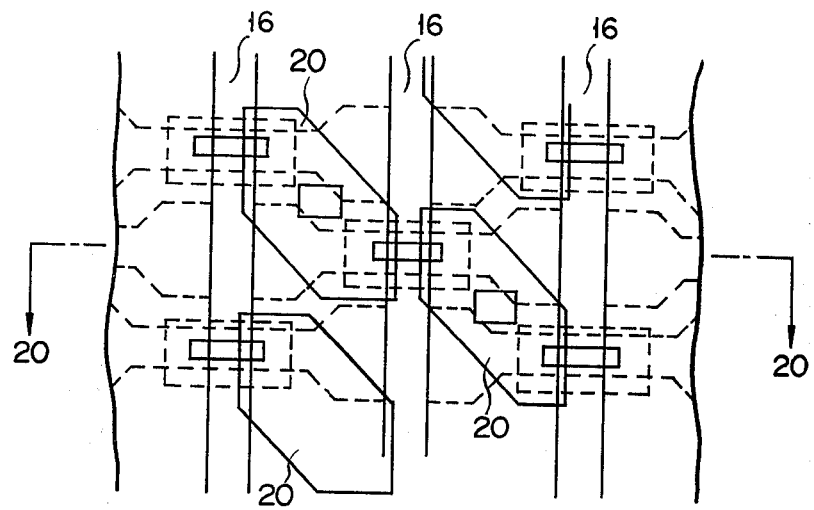
FIG. 19 is a plan view of the semicondcutor structure in the next step.
Figure 20:
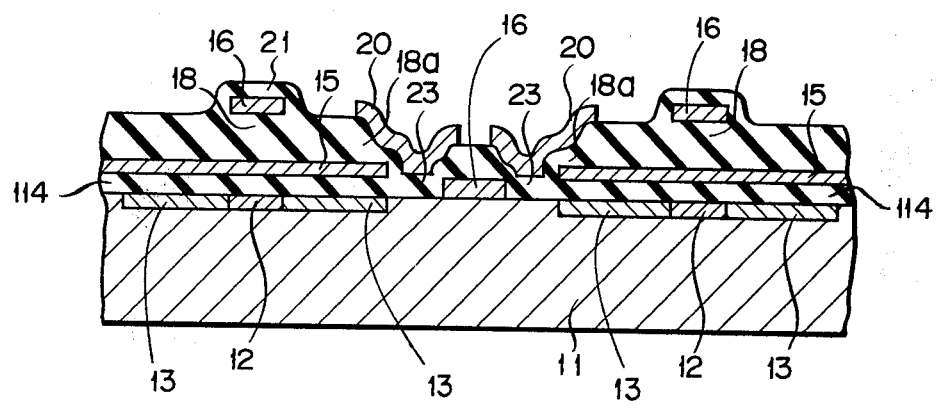
FIG. 20 is a sectional view along the line 20—20 of FIG. 19.

In order to form the address-selecting MOS transistors, after forming the second polycrystalline silicon layers 16, the surface of the substrate 11 is etched, and the gate oxide layers 23 for the address-selecting MOS transistors are formed as shown in FIG. 20. It is preferable that the oxide films 18 and 21 on the first polycrystalline silicon layers 15 and the second polycrystalline silicon layers 16 be more than twice as thick as the gate oxide films 23 for the address-selecting MOS transistors. The oxide film 18 is the oxide film disposed on the first polycrystalline silicon layer 15 between the first and second polycrystalline layers 15 and 16. The oxide film 18a is the oxide film disposed on the first polycrystalline layer 15 between the first and third polycrystalline layers 15 and 20. The third polycrystalline silicon layers 20 are formed on the gate oxide films 23 for address-selecting MOS transistors by chemical vapor deposition and photoetching as shown in FIGS. 19 and 20. In this case, the third polycrystalline silicon layers 20 are so formed as to slightly overlap the first and second polycrystalline silicon layers 15 and 16. When the digit lines, that is, the second polycrystalline silicon layers 16, extend over the field inversion preventive p+-type regions 12, it is preferable to form an insulative layer 18 of over 5,000 Å thickness over the first polycrystalline silicon layers.

Figure 21:
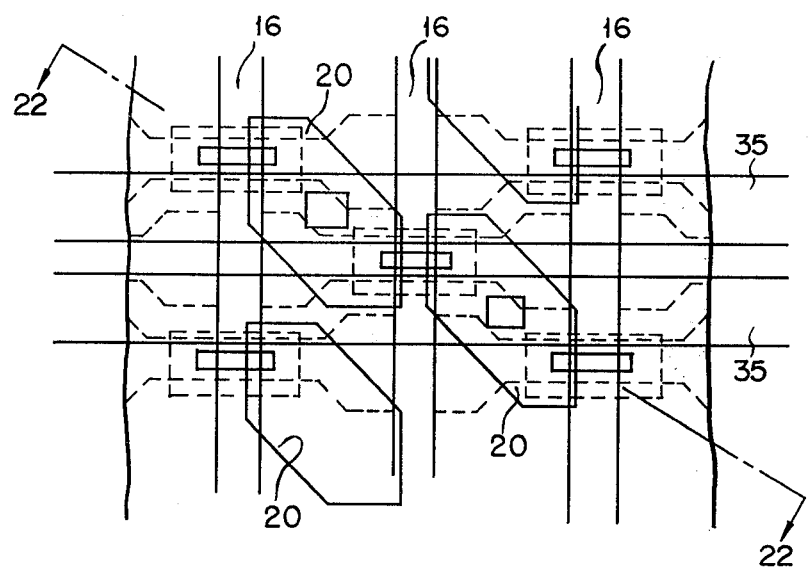
FIG. 21 is a plan view illustrating the semiconductor memory device in the final step.
Figure 22:
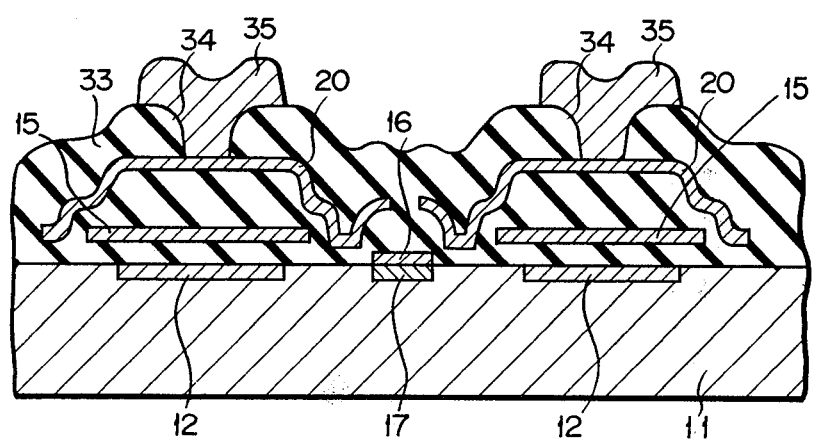
FIG. 22 is a sectional view along the line 22—22 of FIG. 21.

After forming the third polycrystalline silicon layers 20, the passivation film 33 is formed by CVD as shown in FIGS. 21 and 22. The contact holes 34 are selectively formed in the passivation film 33, and the aluminum wirings 35 are formed through these contact holes 34. The gate of the address-selecting transistor is common to two memory cells so that a single contact hole is provided for two memory cells. To illustrate this, FIG. 22 shows a sectional view along the line 22—22 of FIG. 21.

In formation of n+-type regions 17 as the input and output terminals for the memory cells are formed in the above embodiment, it is preferable to dope an impurity of low diffusion coefficient such as arsenic in the second polycrystalline silicon layers 16 in advance and to form the n+-type regions 17 by annealing after the step of thermal oxidation for forming the address-selecting MOS transistors. However, it is also possible to perform the etching of the oxide layers after forming the third polycrystalline silicon layers 20 and to form the n+-type regions 17 in the substrate 11 through the second polycrystalline silicon layers 16. Further, when an impurity is doped and diffused in the second polycrystalline silicon layers 16 in advance, the n+-type drain regions 17 may be formed under the conditions in which thick oxide layers are formed over the second polycrystalline silicon layers 16 so that the coupling capacitance of the address-selecting gate electrode of the memory cell and the second polycrystalline silicon layers may be reduced, and the production of high-speed memory devices may be enabled.

Since it is unnecessary to form thick field oxide films in the field regions, stepped portions are eliminated. Furthermore, since the capacitor electrodes and the field shield layers for the memory cells are formed continuously by the first polycrystalline silicon layers, the packing density may be improved. When the surface of the substrate at the capacitor regions is kept to be of n-type, that is, of the depletion mode, the potential at the first polycrystalline silicon layers for the capacitor electrodes may be arbitrarily set so that the first polycrystalline silicon layers may be freely used as the shield electrodes. Furthermore, the thick field oxide films are not required, the pattern conversion difference during the formation of the field oxide layers is eliminated, and the packing density may be improved.

The field inversion preventive layers for preventing the field inversion may be formed by photoetching for implantation. Thus, the field inversion preventive shield layers and the memory capacitor electrodes are formed so that the packing density per bit may be improved.

Figure 23:
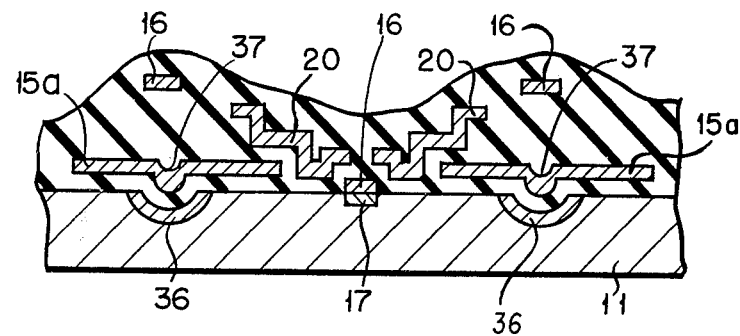
FIG. 23 is a sectional view illustrating the dynamic memory device according to a modification of the present invention.

Since the second polycrystalline silicon layers 16 are formed through the thick insulative layers on the flat first polycrystalline silicon layers 15, there are still some stepped portions remaining on the surface of the memory device. In order to further eliminate such stepped portions, it is possible to construct the memory chip as shown in FIG. 23. That is, recesses 36 are formed in the substrate and recesses 37 are formed in the first polycrystalline silicon layers 15a in correspondence with these recesses 36. The second polycrystalline silicon layers 16 are formed on an insulative layer of a predetermined thickness from the recesses 37. With this structure, the second polycrystalline silicon layers 16 are lowered by the distance corresponding to the recesses 37 so that the stepped portions of the memory chip may be further eliminated. When an oxide layer of as great a thickness as possible, for example, an oxide layer of over 5,000 Å is formed between the first polycrystalline silicon layers 15a and the second polycrystalline silicon layers 16, and the second polycrystalline silicon layers 16 are formed in the etched regions of the substrate by means of the oxide layer, that is, in the recesses, the stray capacitance of the second polycrystalline silicon layers is reduced and the difference in height is decreased.

According to a dynamic memory device of the present invention, polycrystalline silicon layers are used as the digit lines so that the stray capacitance is reduced, the multi-layered wirings are enabled, and the packing density is improved. Furthermore, the data readout regions are formed by self-alignment according to which the impurity is diffused from the second polycrystalline silicon layers constituting the digit lines into the substrate. Thus, the extra spaces for mask alignment are not required so that the packing density may further be improved.

Although the two memory cells are wired by the single digit line in the above embodiment, the present invention is not limited to this. Therefore, it is only necessary to satisfy the requirements to form capacitors by the first polycrystalline silicon layers, to form the digit lines by the second polycrystalline silicon layers, and to form the address-selecting transistors by the third polycrystalline silicon layers to form the n+-type regions through the second polycrystalline silicon layers. Although a p-type substrate is used in the above embodiment, an n-type substrate or an insulative substrate may alternatively be used. However, in this case, the conductivity types of the layers must be reversed from those of the above description to form the MOS capacitors and the MOS transistors. Furthermore, although polycrystalline silicon was used for the first and third polycrystalline silicon layers in the above embodiment, silicide, molybdenum or like materials may alternatively be used if heat-resistant and electrically conductive. However, the material for the second polycrystalline silicon layers is limited to a material which is capable of diffusing an impurity into the substrate for forming the n+-type regions, that is, to polycrystalline silicon, silicide or the like. Although the capacitance between the first and second polycrystalline silicon layers is reduced in the above embodiment, it is preferable to make the insulative layer thicker to reduce the coupling capacitance. Furthermore, it is more preferable to make the insulative layers between the third polycrystalline silicon layers, and the first and second polycrystalline silicon layers thicker to reduce the coupling capacitance.

Figure 24:
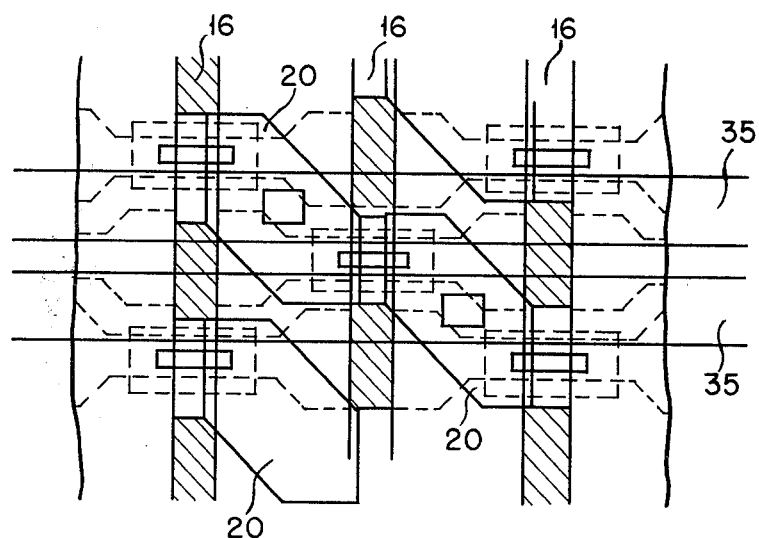
FIG. 24 is a plan view of the dynamic memory device according to still another embodiment of the present invention.

Since the second polycrystalline silicon layers are used as the digit innes as has been already described, it is better to reduce the resistance of the second polycrystalline layers. Since the second polycrystalline silicon layers for forming the embedded contact are the diffusion source for the n+-type regions of the memory cells, and the n+-type diffusion depth is preferably shallow. The impurity concentration of the regions of the second polycrystalline silicon layers below which are formed the embedded layers is limited. From the viewpoint of the requirements for the digit lines, it is preferable that the stray capacitance and the resistance be smaller. Due to this reason, it is preferable to dope an n-type impurity such as phosphorus or arsenic at all parts of the second polycrystalline silicon layers except the embedded regions to reduce the resistance, as shown in FIG. 24 by the cross hatching in portions of second polycrystalline silicon layers 16. It is, of course, preferable to use a laser annealing or the like to improve the mobility.

What is claimed is:
1. A semiconductor memory device comprising:
   a. a semiconductor substrate of a first conductivity type having selectively formed therein a plurality of recesses;
   b. field inversion preventive regions selectively formed in said recesses in said semiconductor substrate;
   c. field inversion regions formed at both sides of said field inversion preventive regions;
   d. a first insulative layer of substantially constant thickness formed on said semiconductor substrate and having a plurality of openings;
   e. first polycrystalline silicon layers insulatively disposed over said field inversion preventive layers and said field inversion layers upon said first insulative layer, said first polycrystalline silicon layers forming capacitors in cooperation with said field inversion layers;
   f. second insulative layers formed on said first polycrystalline silicon layers;
   g. second polycrystalline silicon layers alternately disposed on said second insulative layers and on parts of said semiconductor substrate which are exposed through said openings in said first insulative layer, said second polycrystalline silicon layers functioning as digit lines;
   h. regions of a second conductivity type formed at parts of said semiconductor substrate which are in contact with said second polycrystalline silicon layers;
   i. third polycrystalline silicon layers insulatively disposed over said semiconductor substrate between said first polycrystalline silicon layers and said second polycrystalline silicon layers, said third polycrystalline layers functioning as gates of MOS transistors; and
   j. a third insulative layer disposed as a gate oxide film for insulating said third polycrystalline silicon layers from said substrate, said second insulative layers being more than twice as thick as said third insulative layer.

2. A semiconductor memory device as claimed in claim 1, wherein said third polycrystalline silicon layers are so formed as to partially overlap said first and second polycrystalline silicon layers.

3. A semiconductor memory device as claimed in claim 1, wherein a passivation layer is formed on the entire device.

4. A semiconductor memory device as claimed in claim 1, wherein an impurity of the second conductivity type is doped in said second polycrystalline silicon layers, and said regions of the second conductivity type are formed by diffusing said impurity of the second conductivity type from said second polycrystalline silicon layers.

* * * * *